United States Patent
Krivtsun et al.

(10) Patent No.: US 7,825,390 B2
(45) Date of Patent: Nov. 2, 2010

(54) APPARATUS WITH PLASMA RADIATION SOURCE AND METHOD OF FORMING A BEAM OF RADIATION AND LITHOGRAPHIC APPARATUS

(75) Inventors: Vladimir Mihallovitch Krivtsun, Troitsk (RU); Vadim Yevgenyevich Banine, Helmond (NL); Vladimir Vitalevich Ivanov, Moscow (RU); Evgeny Dmitrievich Korop, Troitsk (RU); Konstantin Nikolaevich Koshelev, Troitsk (RU); Yurii Victorovitch Sidelnikov, Troitsk (RU); Oleg Yakushev, Korolev of Moscow region (RU)

(73) Assignee: ASML Netherlands B.V., Veldhoven (NL)

( * ) Notice: Subject to any disclaimer, the term of this patent is extended or adjusted under 35 U.S.C. 154(b) by 344 days.

(21) Appl. No.: 11/705,822

(22) Filed: Feb. 14, 2007

(65) Prior Publication Data

US 2008/0192218 A1    Aug. 14, 2008

(51) Int. Cl.
    G03B 27/42    (2006.01)
(52) U.S. Cl. .............. 250/503.1; 250/492.2; 250/493.1; 250/505.1; 250/515.1; 250/504 R
(58) Field of Classification Search .............. 250/492.1, 250/492.2, 493.1, 503.1, 504 R, 505.1, 515.1
    See application file for complete search history.

(56) References Cited

U.S. PATENT DOCUMENTS

| | | | |
|---|---|---|---|
| 3,814,972 A * | 6/1974 | Sain ........................... 313/296 |
| 6,377,651 B1 | 4/2002 | Richardson et al. | |
| 6,521,897 B1 * | 2/2003 | Lindquist et al. .......... 250/423 F |
| 6,838,684 B2 | 1/2005 | Bakker et al. ............ 250/492.2 |
| 6,906,788 B2 | 6/2005 | Bakker et al. | |
| 7,145,132 B2 | 12/2006 | Bakker et al. ................ 250/251 |
| 2004/0130694 A1 | 7/2004 | Kurt et al. | |
| 2004/0135985 A1 * | 7/2004 | Bakker et al. .................. 355/69 |
| 2004/0141165 A1 | 7/2004 | Zukavishvili et al. | |

(Continued)

FOREIGN PATENT DOCUMENTS

EP    1 243 970 A1    9/2002

(Continued)

OTHER PUBLICATIONS

International Search Report and Written Opinion for International Application No. PCT/NL/2008/050082 dated Apr. 29, 2008.

*Primary Examiner*—Bernard E Souw
*Assistant Examiner*—Michael J Logie
(74) *Attorney, Agent, or Firm*—Pillsbury Winthrop Shaw Pittman LLP

(57) ABSTRACT

An apparatus for forming a beam of electromagnetic radiation includes a plasma radiation source, and a foil trap provided with a plurality of thin foils that extend substantially parallel to the direction of radiation from the plasma source. A grid is disposed between the plasma radiation source and the foil trap. A space is located between the grid and the foil trap. The apparatus also include an electrical potential application circuit that is constructed and arranged to apply an electrical potential to the grid so that the grid repels electrons emitted by the plasma radiation source and creates a positive space charge between the grid and the foil trap to deflect ions emitted by the plasma radiation source to the foil trap.

20 Claims, 7 Drawing Sheets

U.S. PATENT DOCUMENTS

| | | | |
|---|---|---|---|
| 2005/0098741 A1* | 5/2005 | Bakker et al. | 250/492.2 |
| 2005/0133727 A1* | 6/2005 | Banine et al. | 250/397 |
| 2005/0279946 A1* | 12/2005 | Rettig et al. | 250/396 ML |
| 2006/0138960 A1* | 6/2006 | Derra et al. | 313/618 |
| 2006/0146413 A1 | 7/2006 | Klunder et al. | 359/634 |
| 2006/0219950 A1 | 10/2006 | Bakker et al. | |
| 2006/0289761 A1* | 12/2006 | Nabet et al. | 250/336.1 |
| 2010/0084549 A1* | 4/2010 | Ermakov et al. | 250/283 |

FOREIGN PATENT DOCUMENTS

| | | |
|---|---|---|
| EP | 1 391 785 A1 | 2/2004 |
| EP | 1 422 570 A2 | 5/2004 |

* cited by examiner

APPARATUS WITH PLASMA RADIATION SOURCE AND METHOD OF FORMING A BEAM OF RADIATION AND LITHOGRAPHIC APPARATUS

FIELD

The present invention relates to an apparatus for forming a beam of radiation using a plasma radiation source, a method of forming a beam of radiation, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

United States Patent Application Publication No. 2005/0279946 describes the use of a plasma source to produce EUV radiation for photolithography. It is described that the plasma source may also emit undesirable ions and electrons, which may cause damage to a collector mirror that collects the generated EUV radiation. Various measures are proposed to combat such particles. First of all, a foil trap in combination with a magnetic field is proposed in the path of the EUV radiation between the plasma source and the collector mirror. As an alternative, a grid in combination with a magnetic field is proposed in the path of the EUV from the plasma source to the collector mirror. The grid extends transverse to the direction of propagation of the EUV radiation. The grid serves to slow down ions that travel through the grid, to make their trajectories more sensitive to the magnetic field.

U.S. Pat. No. 6,906,788 describes the use of a first screen positioned in a path of the beam between the radiation system and an optical element. A positive voltage is applied to the first screen to repel positively charged particles away from the optical element. A second screen is positioned in the path of the beam on at least one side of the screen, and a negative voltage is applied to the second screen to repel negative particles away form the first screen.

Foil traps have been found to be effective against relatively slow ions. Unfortunately, foil traps may be less effective against very fast ions (e.g. ions with a kinetic energy corresponding to more than 10 keV).

SUMMARY

It is desirable to reduce damage caused to mirrors in a photolithographic apparatus that uses a plasma source to generate EUV radiation.

According to an aspect of the present invention, an apparatus for forming a beam of electromagnetic radiation is provided. The apparatus includes a plasma radiation source, and a foil trap provided with a plurality of thin foils that extend substantially parallel to the direction of radiation from the plasma source. A grid is disposed between the plasma radiation source and the foil trap. A space is located between the grid and the foil trap. The apparatus also include an electrical potential application circuit that is constructed and arranged to apply an electrical potential to the grid so that the grid repels electrons emitted by the plasma radiation source and creates a positive space charge between the grid and the foil trap to deflect ions emitted by the plasma radiation source to the foil trap.

According to another aspect of the present invention, a method of forming a beam of radiation is provided. The method includes generating radiation from a plasma radiation source; transmitting the radiation through a foil trap; applying an electrical potential to a grid located between the plasma source and the foil trap, a level of the electrical potential being such that grid repels electrons emitted by the plasma radiation source, wherein a, space charge of positively charged ions is created in a space between the foil trap and the plasma source.

According to another aspect of the present invention, a method of forming a beam of radiation is provided. The method includes generating radiation from a plasma radiation source, transmitting the radiation through a foil trap, and generating a net space charge of positively charged ions in a space between the foil trap and the plasma source by applying an electrical potential to a grid located between the plasma source and the space, a level of the electrical potential being such that grid repels electrons emitted by the plasma radiation source.

According to a further aspect of the present invention, there is provided a lithographic apparatus that includes an apparatus for forming a beam of electromagnetic radiation that includes a plasma radiation source, and a foil trap provided with a plurality of thin foils that extend substantially parallel to the direction of radiation from the plasma source. A gird is disposed between the plasma radiation source and the foil trap. A space is located between the grid and the foil trap. The apparatus also include an electrical potential application circuit that is constructed and arranged to apply an electrical potential to the grid so that the grid repels electrons emitted by the plasma radiation source and creates a positive space charge between the grid and the foil trap to deflect ions emitted by the plasma radiation source to the foil trap. The lithographic apparatus also includes a patterning device constructed and arranged to pattern the beam of electromagnetic radiation; and a projection system constructed and arranged to project the patterned beam of electromagnetic radiation onto a substrate.

DESCRIPTION OF THE DRAWINGS

Embodiments of the invention will now be described, by way of example only, with reference to the accompanying schematic drawings in which corresponding reference symbols indicate corresponding parts, and in which:

FIG. 3b illustrates a cross-section of a portion of the apparatus illustrated in FIG. 3a;

FIG. 5b illustrates a cross-section of the portion of the apparatus illustrated in FIG. 5a.

DETAILED DESCRIPTION

Figure 1:
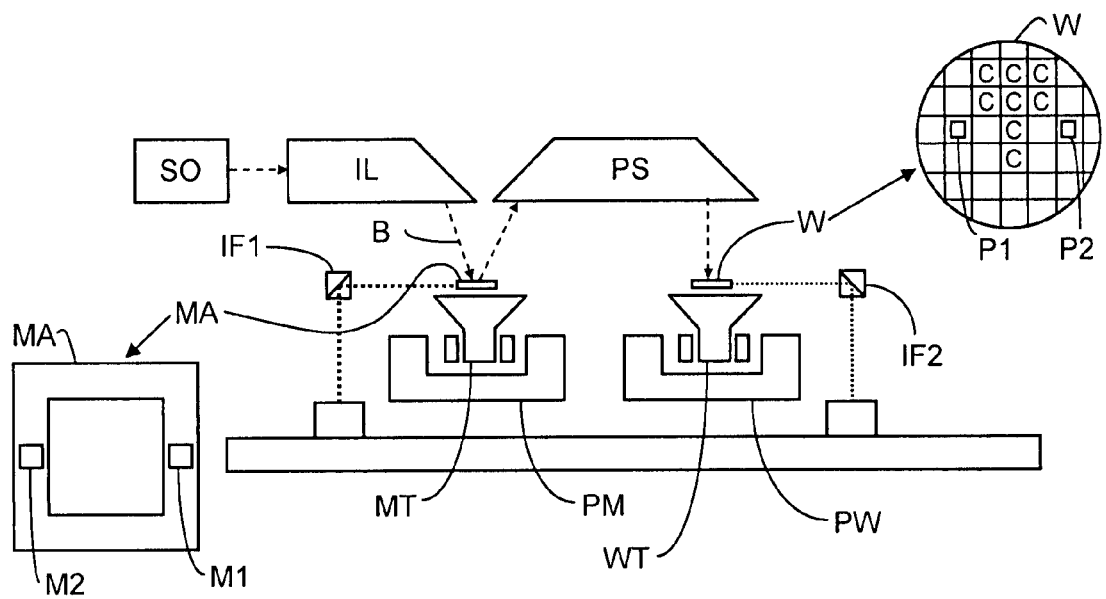
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any advice that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask. Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

Referring to FIG. 1, the illuminator IL receives a radiation beam from a radiation source SO. The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
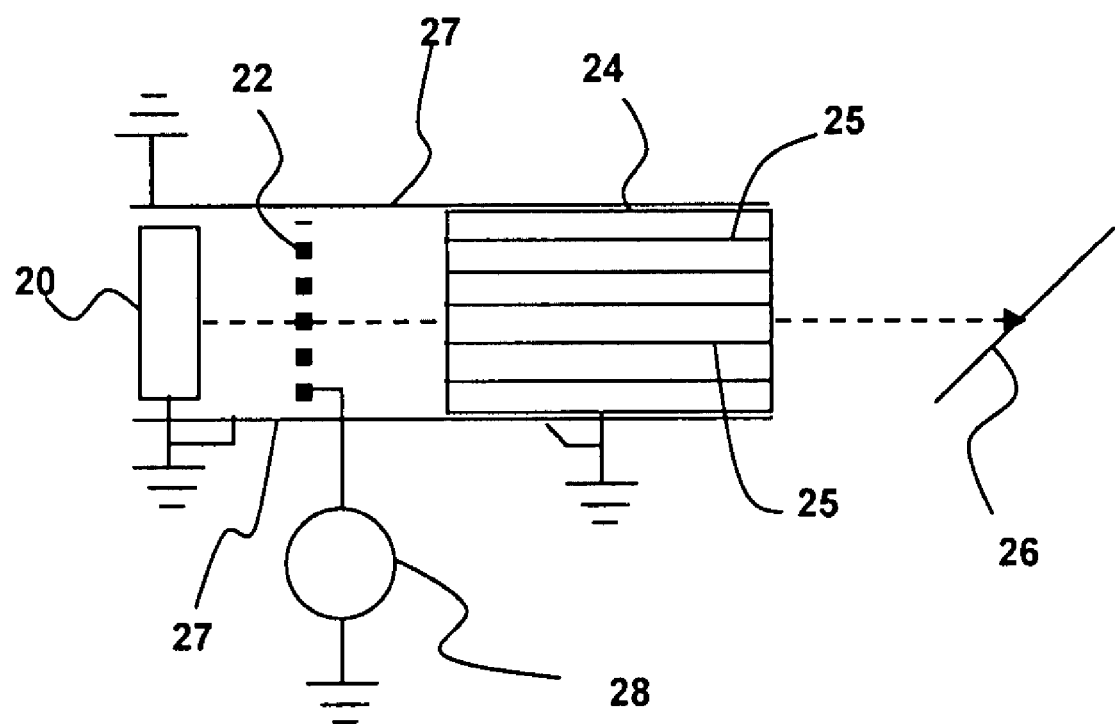
FIG. 2 illustrates an apparatus for forming a beam of radiation according to an embodiment of the invention.

FIG. 2 shows a radiation source assembly comprising a plasma source 20, a grid 22, a foil trap 24 and a collector mirror 26 in that order, arranged to allow electromagnetic radiation, herein briefly termed radiation (preferably EUV radiation) to pass from plasma source 20 to collector mirror 26, between walls 27. Furthermore, the radiation source comprises a voltage source 28 coupled between grid 22 and plasma source 20. Foil trap 24 may include thin foils that extend substantially parallel to the direction or directions of radiation from plasma source 20 to collector mirror 26. In the illustrated embodiment, the foil trap 24 includes foils 25 that each extend along the direction of radiation from plasma source 20, with each foil having a cross-section in a plane transverse to the direction of the radiation, wherein the cross-section is much smaller than the extent of the foil along the direction of radiation, for example, less than one tenth of that extent, or less than one hundredth of that extent. In between the foils 25, the radiation from plasma source 20 can propagate to the collector mirror. The foils 25 serve to catch charged particles whose direction of travel deviates from the direction of propagation of the EUV radiation. More information with respect to a foil trap can be gained from EP 1391785. Grid 22 and foil trap 24 are placed at a predetermined distance from each other. The distance is selected to be large enough to allow a net space charge of ions to develop between grid 22 and foil trap 24, with a net space charge that is sufficiently large to produce an electric field that deflects fast ions by an angle sufficient to deflect these ions from their straight path and catch the ions onto foils of the foil trap 24. In an embodiment, the predetermined distance is between about ten and about forty millimeters. Grid 22 is preferably a flat planar grid, but alternatively a bent grid may be used. At least part of grid 22 has a tangent plane transverse to a virtual line from plasma source 20 to foil trap 24 (i.e. orthogonal or at a non-zero angle different from ninety degrees to this line). In an embodiment, an at least partially planar grid with a plane at an angle different from ninety degrees to the virtual line is used. This has the result that a rotation symmetry axis is avoided. The absence of the axis-symmetry and absence of direction along EUV beam with zero deflecting electric field may be useful to deflect fast ions.

It should be noted that a relatively simple arrangement is shown, which covers only a small solid angle (as is well known a solid angle is a continuous collection of directions in three dimensions). In practice, radiation from plasma source 20 over a wider solid angle may be used. In this case, a grid 22 extending over such a larger solid angle may be used, the grid having a surface shaped as a sector of a spherical surface (e.g. from a pole to a certain latitude). Alternatively, a grid made up of a plurality of straight planar grid sections may be used, wherein the sections are provided at non-zero angles relative to each other, so that the set of sections approximates a spherical sector. Foil trap 24 similarly may extend over a larger solid angle in a way that is known per se.

Voltage source 28 functions as an electrical potential application circuit that applies an electrical potential to the grid 22. Grid 22 has openings with a size that makes grid 22 function as a barrier for electrons arriving from plasma source 20 at grid 22 at the electrical potential applied by voltage source 28. Voltage source 28 has a first terminal coupled to grid 22 and a second terminal coupled to ground. An electrode of plasma source 20 and foil trap 24 are also coupled to ground. The voltage source 28 is designed to make the electrical potential of the first terminal (and thereby the grid) lower than an electrical potential of a surface of plasma source 20 that faces grid 22. The electrical potential of this surface may vary with time. In this case, the electrical potential of the first terminal (and thereby the grid) is made lower than the electrical potential of a surface of plasma source 20 at the time when expanding plasma from plasma source 20 reaches grid 22. At this time, both the anode and cathode of the plasma source are typically at the same electrical potential. As an alternative embodiment, plasma source 20 and foil trap 24 may be at a floating electrical potential.

As mentioned, both electrodes of the anode-cathode system of the plasma source 20 may have the same electrical potential at the time when the expanding plasma reaches grid 22. The main EUV producing discharge in the plasma source will be finished at that time. It should be understood that this electrical potential of plasma source 20, which will be called the "plasma source electrical potential", is not necessarily the ground electrical potential or electrical potential of surrounding walls 27. Instead, it is the electrical potential difference between grid 22 and the surface of the plasma source 20 that faces grid 22. It should be appreciated that the connection to ground of the second terminal of voltage source 28, plasma source 20 and foil trap 24 is only one example of a possible electrical configuration to control this electrical potential difference.

In operation, grid 22 is placed at a electrical potential that causes grid 22 to generate an electric field that exerts a force on positive charges directed from plasma source 20 to grid 22, so as to repel electrons from the grid and attract (positively charged) ions. The resulting field prevents at least part of the electrons emitted by plasma source 20 from passing grid 22. The electrical potential causes grid 22 to pass (and even accelerate) positive ions from plasma source 20. As a result, a net positive space charge is built up in the space between grid 22 and foil trap 24, at least if the average net plasma current from plasma source 20 is zero.

The net positive space charge that is built up in the space between grid 22 and foil trap 24 creates an electric field that deflects ions that travel from plasma source 20 towards foil trap 24. As a result, more ions should be captured by foil trap 24 than without the grid. It has been found that this effect is effective to also trap fast ions, which may not be effectively intercepted by conventional foil traps without the preceding grid 22. Fast ions may be a special problem, for example, when a z-pinch plasma source is used. To realize the deflection effect, a certain minimum amount of space is desirable between grid 22 and foil trap 24 to provide room for the space charge. When the solid angle of the foil trap is small, the distance between grid 22 and foil trap 24 is preferably at least of the same order of magnitude as the diameter of foil trap 24, for example at least one quarter, and more preferably at least one half, of a radius of a cross-section of foil trap 24 transverse to a virtual line between plasma source 20 and foil trap 24. In a typical example, a distance of at least ten millimeters is used. When radiation is gathered over large solid angle, a similar distance may be used, but should be at least equal to a plurality of times (e.g. ten times) the distance between successive foils of the foil trap. An upper limit of the distance between grid 22 and foil trap 24 is generally determined by the available space and not by considerations of the effectiveness of deflection. In a typical example, a distance of up to forty millimeters may be used, but larger distances are acceptable if space is available. In an embodiment, voltage source 28 is configured to apply a negative electrical potential of between zero and five hundred Volts to grid 22 relative to ground, or if the exterior of plasma source 20 is not at ground electrical potential, relative to the plasma source.

The deflecting electric field is due to a positive charge gradient across grid 22. To increase this gradient, the apparatus may include walls 27 adjacent the space between plasma source 20 and grid 22. In an embodiment, conducting walls are used and are maintained at the same electrical potential as grid 22. A net space charge of ions will tend to form near walls 27, thereby creating a small positive charge there, with a deflecting effect on other ions. The use of walls 27 is even more advantageous when the EUV radiation is collected over a large solid angle.

When foil trap 24 has a floating electrical potential, foil trap 24 will become positively charged as well, increasing the effectiveness of the system, although in this case there is a risk of parasitic breakdown, which may introduce additional type of debris particles.

In another embodiment, grid 22 may be placed at ground electrical potential (or more generally at the same electrical potential as the facing surface of plasma source 20). In this case, voltage source 28 may be a simple connection to ground. This embodiment works because plasma has a tendency to develop a net positive electrical potential relative to surrounding structures such as the facing surface of plasma source 20, since electrons tend to be absorbed sooner by the surroundings structures than positively charged ions. Hence, grid 22 will have a repelling effect on electrons (and an attractive effect on ions) even if grid 22 is at the same electrical potential as the surface of plasma source 20 (e.g. ground electrical potential). Of interest is the repelling effect of grid 22 on electrons in the plasma (and correspondingly its attractive effect on ions). However, use of a negative electrical potential at grid 22 relative to the surroundings may make the generation of the space charge more effective and may allow for the use of a grid 22 with larger mesh spacing.

In an embodiment, grid 22 is composed of at least two arrays of parallel conductive elements, the elements of different arrays intersecting each other. The conductive elements may be integral parts of grid, or woven elements. Alternatively, a grid with holes machined are etched into it may be used. Thus, the grid has openings. As another alternative, an array of only parallel conductive elements may be used in grid 22. Any structure of grid 22 is possible, provided that it provides a large optical transparency and electrical openings of a limited size that serve to obstruct electrons.

In an embodiment, the size of the openings (define here as the maximum distance from any point in the (straight or curved) plane of the grid to the nearest point on a conductive element of grid 22) is preferably so small that electrons are repelled everywhere by grid 22. This may be achieved by making the size less than or equal a length in the order of magnitude of the Debye length of the plasma on the plasma source side of grid 22. As is well known, the Debye length is an intrinsic property of a plasma. Plasma increasingly shields the effect of charged regions, such as the elements of grid 22, at increasing distances from the charges. The Debye length, which depends on the diffusion coefficient and the mobility of electrons in the plasma, indicates a characteristic distance at which this shielding starts to become predominant.

By applying a more negative electrical potential to the grid 22, it is possible to use openings with a larger size and still repel electrons. Larger size openings have the advantage that more EUV radiation is passed. The negative electrical potential helps to increase the barrier for electrons in the centre of the openings. The maximum size L is preferably less than or equal to (and more preferably substantially equal to):

$$L=Rd*\mathrm{sqrt}(1-Vg/Vp)$$

wherein "Rd" is the Debye length of the plasma, "sqrt" is the square root function, Vg is the grid electrical potential and Vp is the plasma electrical potential (the difference between the plasma electrical potential and electrical potential of the exterior of plasma source 20, or ground in an embodiment where the plasma source is at ground electrical potential at the relevant time point). Thus for zero and negative grid voltages, the maximum grid opening is preferably at least equal to the Debye length (Rd) of the plasma. When the electrical potential of grid 22 is more negative, larger openings can be used, which permit more radiation to pass. In a typical example, L is selected in a range of about 0.05 to about 1 millimeter. This provides for sufficiently small openings to substantially block electrons and sufficiently large optical transparency.

In use, etching of grid 22 by fast ions may be a problem that necessitates periodic replacement of grid 22. The replacement period may be extended by using a grid 22 with a greater thickness, for example with a size of about 100 μm and about 1 mm in length in the direction of travel through the grid.

Figure 3A:
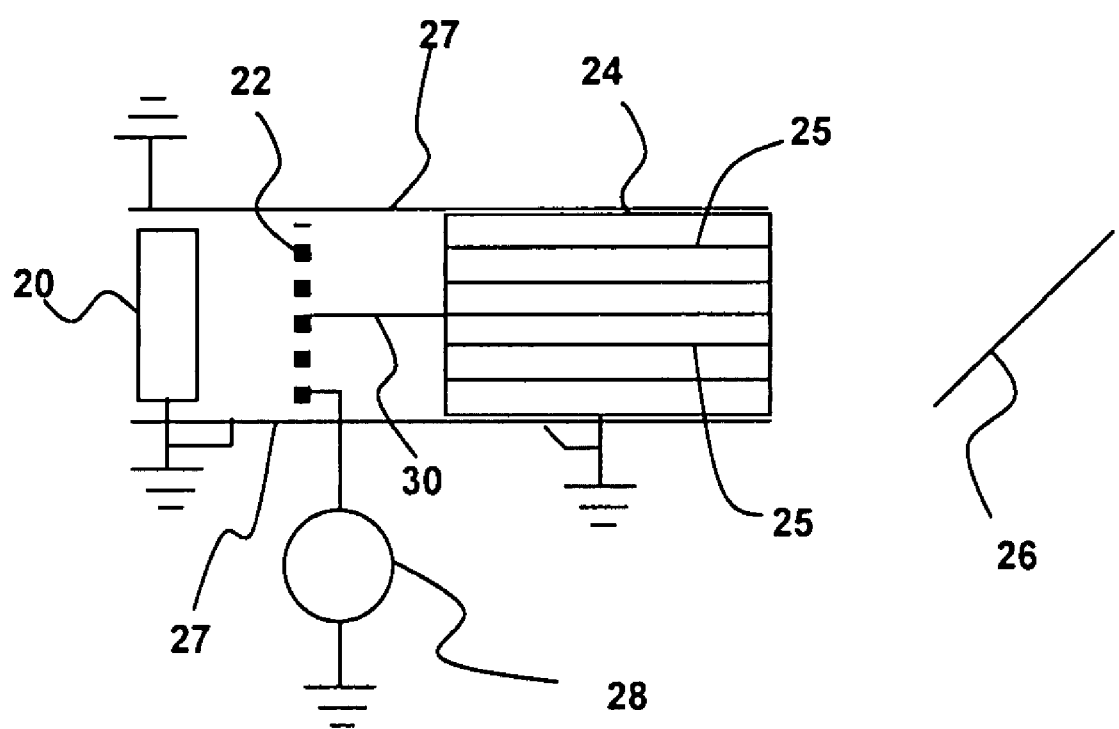
FIG. 3a illustrates an apparatus for forming a beam of radiation according to another embodiment of the invention.
Figure 3B:
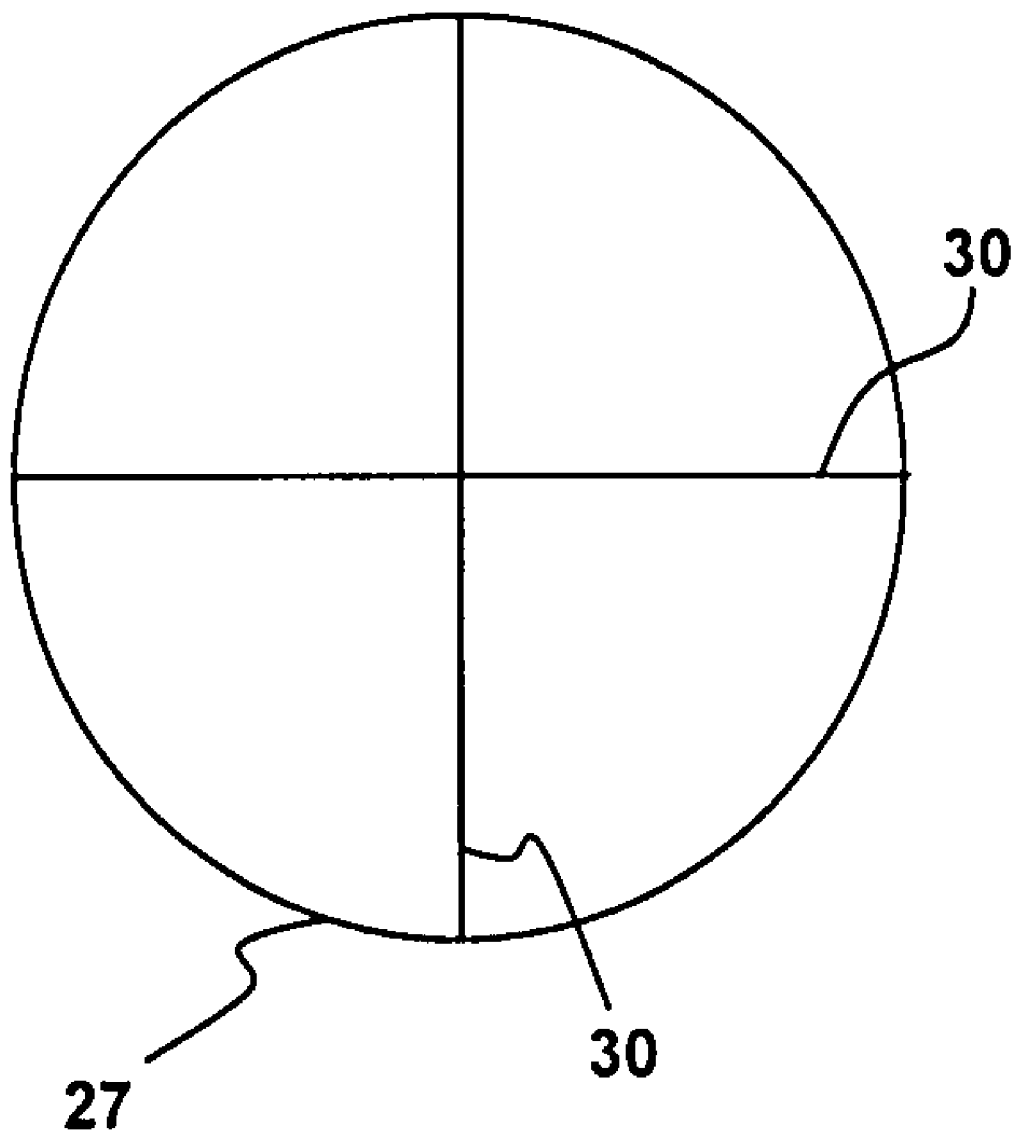

FIG. 3a shows an embodiment wherein additional separations 30 (one shown) have been included in the space between grid 22 and foil trap 24. Preferably, separations 30 are conductive and, preferably, their electrical potential is maintained at the same electrical potential as grid 22. FIG. 3b shows the separations 30 in cross-section. In an embodiment, separations 30 may be realized by extending part of the foils of foil trap 24 into the space between the full foil trap 24 and grid 22. Separations 30 separate the space charge in the space between grid 22 and foil trap 24 into independent space charges. It has been found that edge regions near the edge of the space charge are most effective in deflecting ions. When a large area of space charge is used, the diameter of the space charge is larger than this edge region, so that part of the space charge region does not contribute optimally to deflection. Separations 30 in the space between grid 22 and foil trap 24 have the effect of creating smaller space charge regions, wherein the edge regions with optimal deflection properties form a larger part. Thus, more efficient deflection is realized. Preferably, separations 30 divide the space between grid 22 and foil trap 24 into compartments that are about as long (in the direction from grid 22 to foil trap 24) as wide (transverse to that direction). This has been found to provide optimal results. In an example, distances of about ten to about forty millimeters may be used between separations 30 (between the radial tips of the separations when the separations are provided radially). In an embodiment, the diameter of the compartments (the length of the longest virtual line in between adjacent separations 30 in a plane orthogonal to a virtual line from grid 22 to foil trap 24) is between half and twice the distance between grid 22 and the foil trap 24.

The distance between successive foils 25 of foil trap 24 is typically much smaller than the distance between separations 30, such that no space charge can develop that has a relevant deflecting effect within foil trap 24. In an example, the distance between successive foils (at the radial tips) is about one or two millimeters. In contrast, sufficient space should be used between separations 30 to allow for formation of space charge. Hence, when separations 30 are formed by extensions of foils of foil trap 24, only some of the foils 25, for example, one out of between five to thirty foils, of foil trap 24 should be extended to form separations 30. As an alternative, separations 30 may be used that are not extensions of foil trap 24. However, the use of separations 30 that are extensions of foil trap 24 may simplify construction.

Grid 22 may be a substantially flat grid (wherein the size of the openings is larger than the thickness of the grid). In another embodiment, the size of the openings is less than the thickness of the grid. Thus, the walls of the openings extend in the direction from grid 22 to foil trap 24 over a distance that is larger than their size transverse to that direction. This may have the advantage of improving cooling of grid 22. However, the extent of the elements of grid in the direction from grid 22 to foil trap 24 is preferably limited to prevent the grid 22 from acting as a strong foil trap that traps ions. As grid 22 is used to create a space charge in the space between grid 22 and foil trap 24 from ions that travel from plasma source 20 to grid 22, it is undesirable that grid 22 traps too many ions. An extent of at most ten times the opening diameter of openings in grid 22 is preferably used.

Figure 5A:
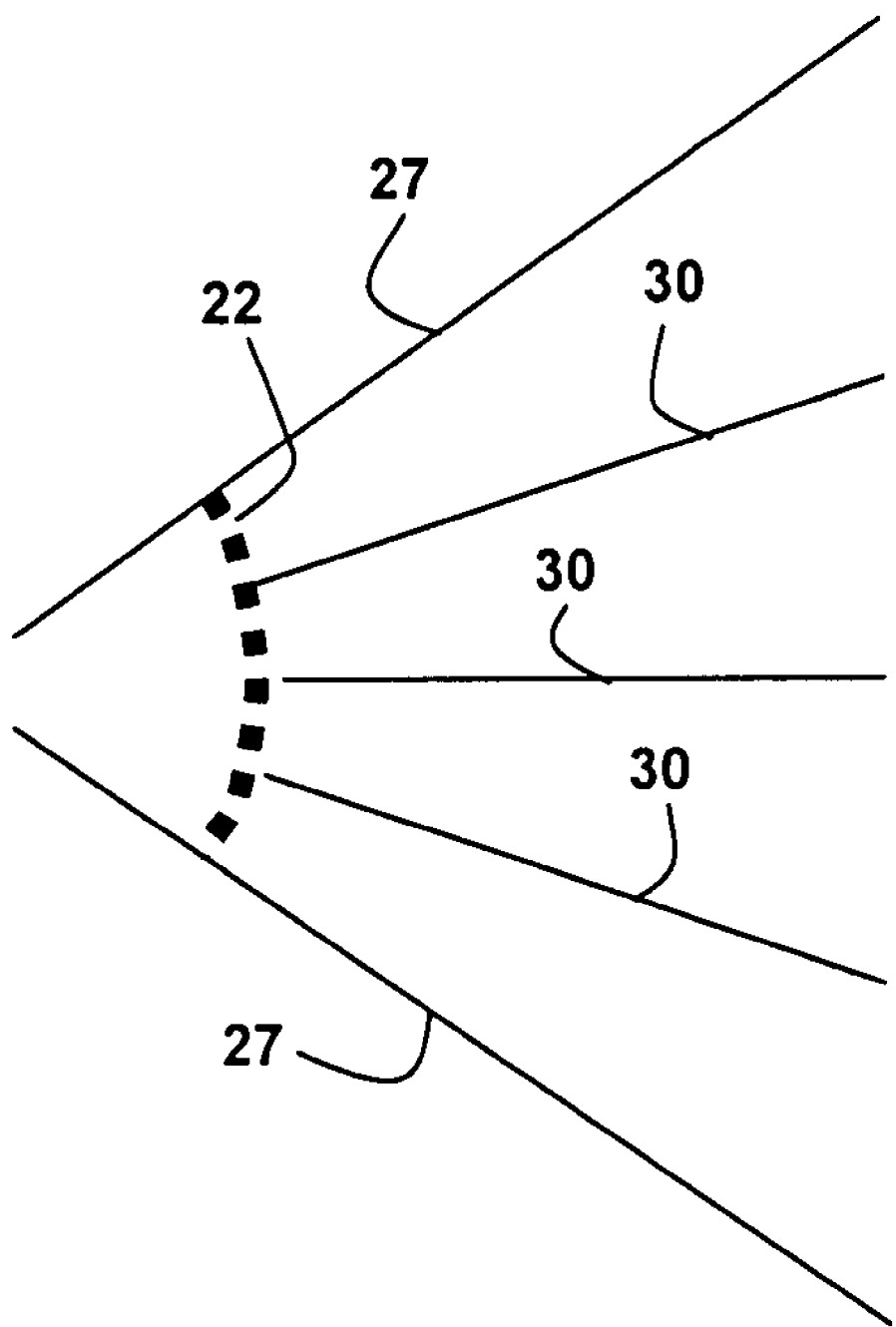
FIG. 5a illustrates a portion of an apparatus for forming a beam of radiation according to another embodiment of the invention.
Figure 5B:
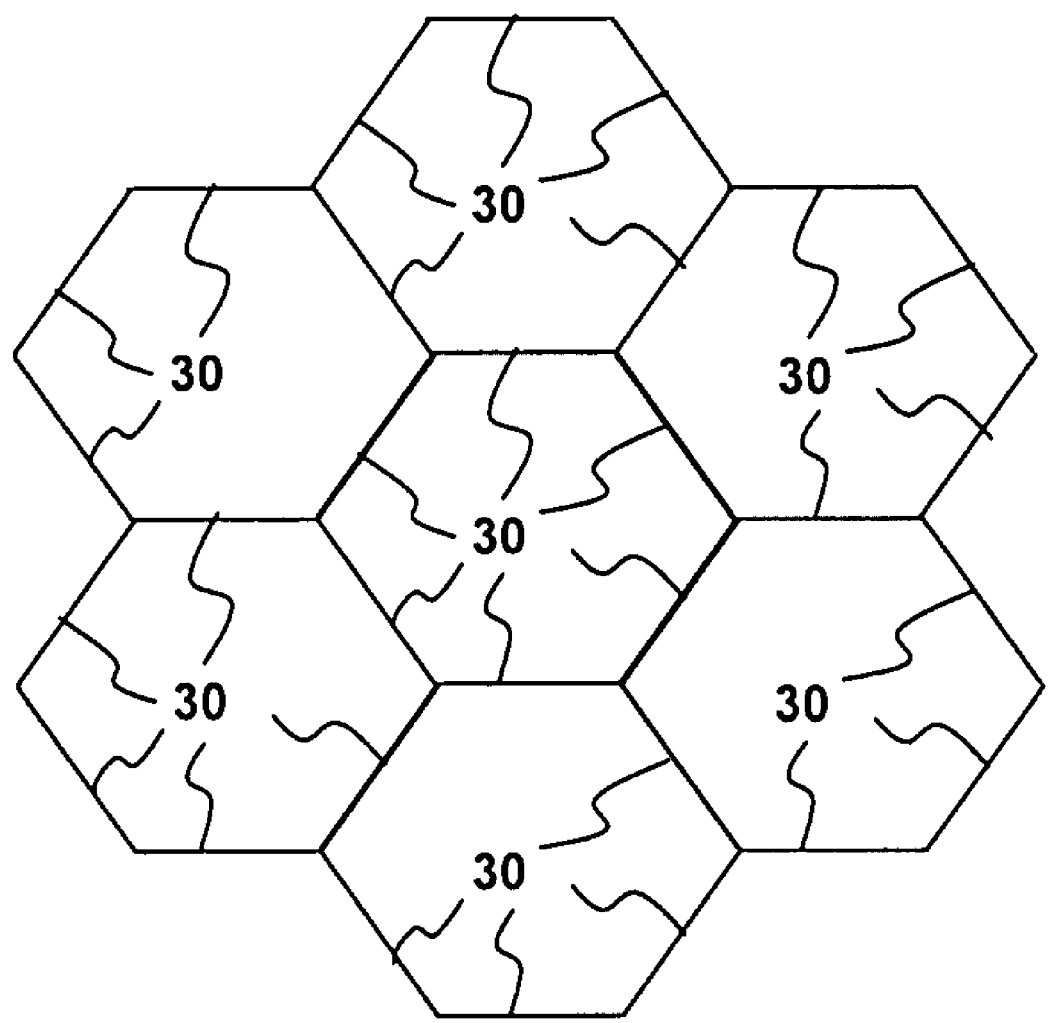

Although a single structure with a grid and foil trap has been shown, it should be understood that in an embodiment, a plurality of connected structures of this kind may be used, located next to each other to cover large solid angle of a EUV source. FIGS. 5a and 5b illustrate an embodiment with a plurality of separations 30 arranged to cover the cross-section of the radiation from the plasma source (not shown) to the foil trap (not shown) at regular intervals, for example a honeycomb structure of separations 30 as shown in FIG. 5b, in cross section. Other arrangements may be used to separate the space between grid 22 and the foil trap in two dimensional compartments. As shown, grid 22 may have the shape of a section of a sphere, covering a large solid angle, or it may be composed of flat planar sections. Separation 30 may be a set of a plurality of flat surfaces directed parallel to the beam from the plasma source to the location of separation 30. Thus, instead a single central line from which all separations extend, as shown in FIG. 3b, there are a plurality of central lines, each central line corresponding to a group of separations that extend from that central lines. The central lines are virtual lines radiating from the plasma source 20, for example, in a two dimensional grid of directions. In the example of FIG. 5b, the intersections between the separations form such lines.

In an embodiment, a flow of gas is introduced in foil trap 24 to remove secondary sputtered debris from grid 22 and foil trap 24. In this or another embodiment, an additional foil trap (not shown), for example, a rotating foil trap may be added between plasma source 20 and grid 22. This further reduces the number of ions and contamination of the grid.

Figure 4:
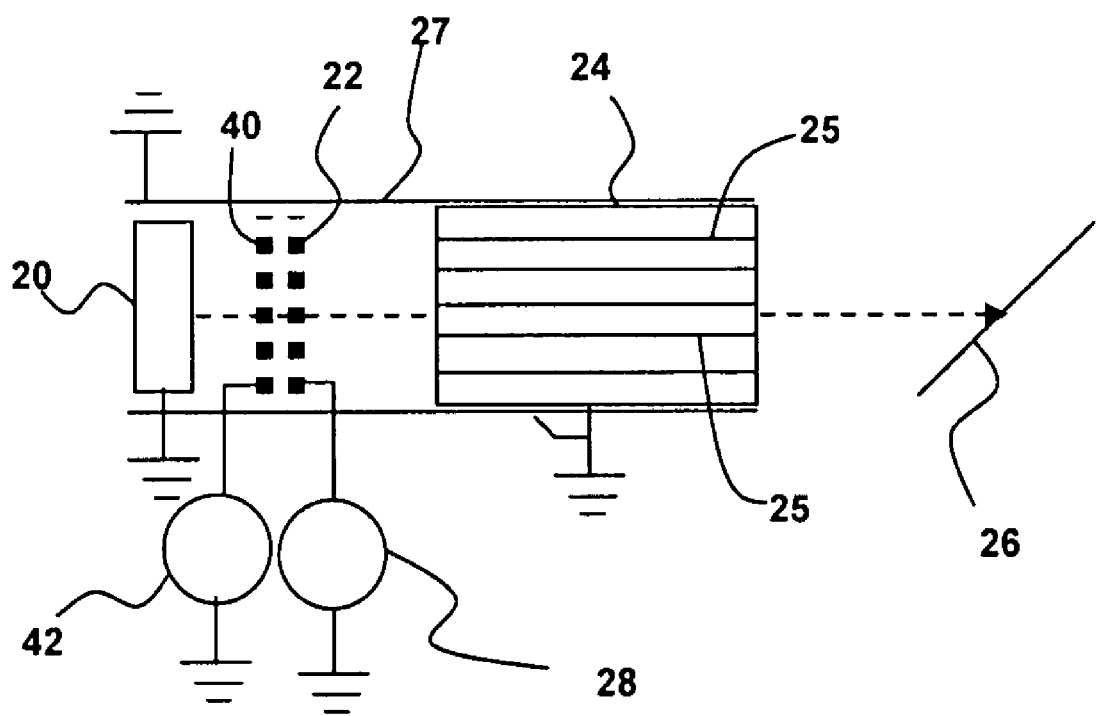
FIG. 4 illustrates an apparatus for forming a beam of radiation according to another embodiment of the invention.

FIG. 4 shows an embodiment in which an additional grid 40 has been added between plasma source 20 and grid 22. Additional grid 40 has been coupled to ground via an additional voltage source 42. Additional grid 40 serves to reduce the number of electrons that are absorbed by grid 22. Additional grid 40 forms a sink of plasma electrons nearer to grid 22 than the plasma source 20 and the walls. This increases the volume space charge behind grid 22, which in turn increases the deflecting electric field. Additional grid 40 leads to more effective electron trapping. Without additional grid 40, plasma electrons would be trapped only at a greater distance from grid 22, at the plasma source or the walls. The resistance to these structures will be large, which decreases the number of trapped electrons and space charge. Preferably, additional grid 40 has a larger spatial extent than grid 22 (for example in the direction towards plasma source 20, providing better contact with the plasma) and it may have a larger opening size than grid 22.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An apparatus for forming a beam of electromagnetic radiation, the apparatus comprising:
   a plasma radiation source;
   a foil trap provided with a plurality of thin foils that extend substantially parallel to the direction of radiation from the plasma source;
   a grid disposed between the plasma radiation source and the foil trap, wherein a space is located between the grid and the foil trap;
   a wall adjacent a second space located between the plasma radiation source and the grid; and an electrical potential application circuit constructed and arranged to apply an electrical potential to the grid so that the grid repels electrons emitted by the plasma radiation source and creates a positive space charge between the grid and the foil trap to deflect ions emitted by the plasma radiation source to the foil trap, and to apply the electrical potential to the wall.

2. The apparatus according to claim 1, wherein the electrical potential application circuit comprises a voltage source configured to apply a voltage difference between the grid and at least a surface of the plasma radiation source that faces the grid with a polarity so that the grid is at a negative electrical potential relative to a electrical potential at the surface of the plasma radiation source.

3. The apparatus according to claim 1, wherein the electrical potential application circuit is configured to apply the same electrical potential to the grid and a surface of the plasma radiation source that faces the grid.

4. The apparatus according to claim 1, wherein the grid has a curved shape conforming to a segment of a sphere, or a plurality of plane segments at angles relative to one another distributed according to a virtual sphere segment.

5. The apparatus according to claim 1, further comprising at least one separation that divides the space between the grid and the foil trap into compartments, each compartment having a size larger than a space between foils of the foil trap, the compartments extending from the grid towards the foil trap.

6. The apparatus according to claim 5, wherein the at least one separation is an extension of one of the foils of the foil trap.

7. The apparatus according to claim 5, wherein the compartments have a diameter between about one-half and two times the distance between the grid and the foil trap.

8. The apparatus according to claim 5, wherein the at least one separation comprises a plurality of separations extending at mutual angles from a plurality of lines radiating from the plasma radiation, source.

9. The apparatus according to claim 1, wherein the grid comprises elongated grid elements that extend further in a first direction from the plasma source to the foil trap than in a second direction transverse to the first direction.

10. The apparatus according to claim 1, wherein grid openings of the grid have a size less than or equal to a Debye length of a plasma that is be generated during operation by the plasma source on a plasma source side of the grid, multiplied by the square root of one minus a ratio of a electrical potential of the grid divided by a electrical potential difference between the plasma on a plasma source side of the grid and the electrical potential of the plasma source.

11. The apparatus according to claim 1, wherein a distance between the grid and the foil trap is at least equal to one-half of a radius of the foil trap.

12. The apparatus according to claim 1, further comprising a second grid between the grid and the plasma source, and a second electrical potential application circuit configured to apply a further electrical potential to the second grid that is higher than an electrical potential applied to the grid by the electrical potential application circuit.

13. A method of forming a beam of radiation, the method comprising
generating radiation from a plasma radiation source;
transmitting the radiation through a foil trap;
generating a net space charge of positively charged ions in a space between the foil trap and the plasma source by applying an electrical potential to a grid located between the plasma source and said space, a level of the electrical potential being such that grid repels electrons emitted by the plasma radiation source; and
applying the electrical potential to a wall adjacent a second space between the plasma radiation source and the grid.

14. The method according to claim 13, further comprising applying a negative electrical potential to the grid relative to an electrical potential of a surface of the plasma source that faces the grid.

15. The method according to claim 13, further comprising applying the same electrical potential to the grid and a surface of the plasma source that faces the grid.

16. The method according to claim 13, further comprising separating space charge between the grid and the foil trap into separate space charges in a plurality of separated compartments.

17. The method according to claim 13, wherein the distance between the grid and the foil trap is at least equal to one-half of a radius of the foil trap.

18. The method according to claim 13, further comprising collecting electrons with a second grid between the grid and the plasma source.

19. A lithographic apparatus comprising:
a beam forming apparatus constructed and arranged for forming a beam of electromagnetic radiation, the beam forming apparatus comprising
  a plasma radiation source,
  a foil trap provided with a plurality of thin foils that extend substantially parallel to the direction of radiation from the plasma source,
  a grid disposed between the plasma radiation source and the foil trap, wherein a space is located between the grid and the foil trap,
  a wall adjacent a second space located between the plasma radiation source and the grid, and
  an electrical potential application circuit constructed and arranged to apply an electrical potential to the grid so that the grid repels electrons emitted by the plasma radiation source and creates a positive space charge between the grid and the foil trap to deflect ions emitted by the plasma radiation source to the foil trap, and to apply the electrical potential to the wall;
a patterning device constructed and arranged to pattern the beam of electromagnetic radiation; and
a projection system constructed and arranged to project the patterned beam of electromagnetic radiation onto a substrate.

20. A method of forming a beam of radiation, the method comprising:
generating radiation from a plasma radiation source;
transmitting the radiation through a foil trap; and
applying an electrical potential to a grid located between the plasma radiation source and the foil trap, and to a wall adjacent a space between the plasma radiation source and the grid, a level of the electrical potential being such that grid repels electrons emitted by the plasma radiation source, wherein a space charge of positively charged ions is created in a second space between the foil trap and the plasma source.

* * * * *